(12) United States Patent
Camp

(10) Patent No.: US 9,300,280 B2
(45) Date of Patent: Mar. 29, 2016

(54) SINGLE-POWER DUAL-POLARITY MARX BANK CIRCUIT

(71) Applicant: James Thomas Camp, King George, VA (US)

(72) Inventor: James Thomas Camp, King George, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 408 days.

(21) Appl. No.: 14/055,837

(22) Filed: Oct. 16, 2013

(65) Prior Publication Data

US 2015/0102690 A1 Apr. 16, 2015

(51) Int. Cl.
*H03K 3/00* (2006.01)
*H03K 3/537* (2006.01)
*H02J 1/06* (2006.01)
*H03K 3/53* (2006.01)

(52) U.S. Cl.
CPC . *H03K 3/537* (2013.01); *H02J 1/06* (2013.01); *H03K 3/53* (2013.01)

(58) Field of Classification Search
CPC .............. H03K 3/537; H03K 3/53; H02J 1/06
See application file for complete search history.

(56) References Cited

U.S. PATENT DOCUMENTS

| 3,845,322 | A | * | 10/1974 | Aslin | H03K 3/537 307/108 |
|---|---|---|---|---|---|
| 5,008,798 | A | | 4/1991 | Harvey | 363/59 |
| 5,151,663 | A | | 9/1992 | Harvey | 330/41 |
| 5,311,067 | A | * | 5/1994 | Grothaus | H03K 3/55 307/108 |
| 5,798,579 | A | * | 8/1998 | McPhee | H03K 3/537 307/106 |
| 2005/0285447 | A1 | * | 12/2005 | Mayes | H03K 3/537 307/106 |

OTHER PUBLICATIONS

Casey et al., "Solid-State Marx Bank Modulator for the Next Linear Collider", EPAC 2004. http://www.researchgate.net/publication/4062009_Solid-state_Marx_bank_modulator_for_the_next_linear_collider%2Ffile%2F9fcfd5086f2c85d4eb.pdf.
Kempkes et al., "Marx Bank Technology for the International Linear Collider", PAC07. http://accelconf.web.cern.ch/accelconf/p07/PAPERS/THOBKIO2.PDF.
Casey et al., "Marx Bank Technology for Accelerators and Colliders", EPAC08. http://accelconf.web.cern.ch/accelconf/e08/papers/tupd008.pdf.

* cited by examiner

*Primary Examiner* — Daniel Cavallari
(74) *Attorney, Agent, or Firm* — Gerhard W. Thielman, Esq.

(57) ABSTRACT

A high voltage circuit is provided for electrical pulse generation. The circuit includes an input voltage supply, a ground potential, a difference load, inverting and non-inverting Marx bank circuits connected respectively to output voltage nodes. The voltage supply has positive and negative terminals, with ground connecting to the voltage supply at the negative terminal. The output voltage nodes connect to the load. The inverting Marx bank circuit has a first n-plurality of stages in parallel, connecting at a first stage to the positive terminal and at a last stage at the inverting output node. The non-inverting Marx bank circuit has a second plurality of stages in parallel, connecting at a first stage to the positive terminal and at a last stage at the non-inverting output node. The load combines the inverting output voltage of minus n-times the input voltage with the non-inverting output voltage of plus n-times the input voltage for a total of 2n-times the input voltage.

3 Claims, 4 Drawing Sheets

Output Voltage of Dual Polarity Marx Bank

SINGLE-POWER DUAL-POLARITY MARX BANK CIRCUIT

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to Marx bank electrical discharge. In particular, the invention relates to halving the number of power supplies for a given voltage.

Various high power applications include charging of a dipole antenna, pulse charging, streamer-plasma generation, high power microwave generation. Such high voltage (HV) operations benefit from using a dual-polarity pulse (+HV, −HV) in favor over a single-polarity pulse (HV, ground). The conventional way to generate a high voltage single-polarity pulse is to use a Marx bank, originally developed by Erwin Otto Marx in 1924.

SUMMARY

Conventional Marx bank circuits yield disadvantages addressed by various exemplary embodiments of the present invention. In particular, various exemplary embodiments provide a high voltage circuit for electrical pulse generation. The circuit includes an input voltage supply, a ground potential, a difference load, inverting and non-inverting Marx bank circuits connected respectively to output voltage nodes. The load combines the inverting output voltage of minus n-times the input voltage with the non-inverting output voltage of plus n-times the input voltage for a total of 2n-times the input voltage.

The voltage supply has positive and negative terminals, with ground connecting to the voltage supply at the negative terminal. The output voltage nodes connect to the load. The inverting Marx bank circuit has a first n-plurality of stages in parallel, connecting at a first stage to the positive terminal and at a last stage at the inverting output node. The non-inverting Marx bank circuit has a second plurality of stages in parallel, connecting at a first stage to the positive terminal and at a last stage at the non-inverting output node.

Each stage of the first and second n-pluralities includes a charge loop and a first resistor, the charge loop having a second resistor, a gap switch and a capacitor in series. The first resistor connects in series to the positive terminal at a first node. The charge loop has a second node connecting the first resistor to the gap switch and to the capacitor. A third node connects the capacitor to the second resistor. A fourth node connects the second resistor to the gap switch. Adjacent stages connect together with the gap switch connecting to a downstream adjacent first resistor at the second node, and to an upstream capacitor and second resistor at the fourth node.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention.

Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Various exemplary embodiments provide a circuit configuration to create a dual-polarity high voltage pulse based on inverting and non-inverting Marx banks. Higher voltages can be obtained with less electrical stress on the pulse generator than a conventional circuit, and with only a single high voltage power supply.

This configuration applies for any n-stage Marx bank. For the purpose of this disclosure, a 4-stage and 8-stage Marx bank are discussed as an example. Artisans of ordinary skill will recognize the description of four stages for an exemplary Marx bank as presented for explanatory purposes, and thus not limiting to the scope of the invention.

Development of high voltage pulses can be costly. The cost of a Glassman high voltage power supply can range from $2,000 to $15,000 dollars, depending on the power rating and output voltage. Raising voltage levels requires increasing the quantity of insulating material needed to contain the electrical stress, thereby producing bulky heavy systems. A dual-polarity pulse generator produces a voltage pulse with half the electrical stress as a single-polarity pulse generator with the same voltage amplitude. In other words, the physical size and weight of a dual-polarity pulse generator would be less than that of a single-polarity pulse generator.

Figure 1:
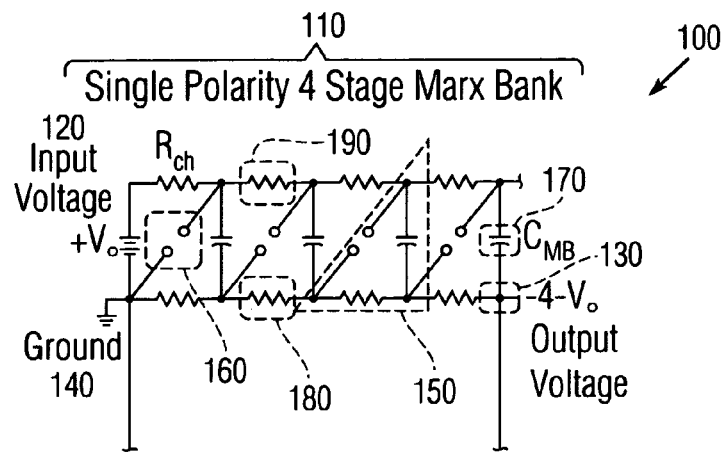
FIG. 1 is a schematic view of a single-polarity Marx bank.

FIG. 1 shows a schematic view 100 of a single-polarity four-stage Marx bank 110 as an electric circuit. A source for input voltage 120 is $+V_o$, while output voltage 130 is $-4 \cdot V_o$, or minus four times the input voltage level $V_o$. The input voltage 120 includes positive and negative terminals, and connects directly to a fixed potential known as ground 140 at the negative terminal.

In the exemplary embodiment shown, a parallel circuit of four charge loops 150 is disposed between input and output voltages 120 and 130. Each charge loop 150 has a Δ-circuit configuration that includes a spark gap switch 160, a capacitor 170 of $C_{MB}$ and a first resistor 180 connected in a triangular geometry. A second resistor 190 connects the loop 150 to the input voltage 120 and to the adjacent gap switch 160. The first and second resistors 180 and 190 have electrical resistance of $R_{ch}$. The input voltage 120, such as from a direct current battery, charges the capacitors 170 for discharge across the gap switch 160.

The discharge enables current to flow, thereby yielding transient electrical power. The second resistor 190 connects to the positive terminal and to the charge loop 150 that comprises the switch 160, the capacitor 170 and the first resistor 180. An adjacent switch 160 connects to a junction of the first resistor 180 and the capacitor 170.

Figure 2:
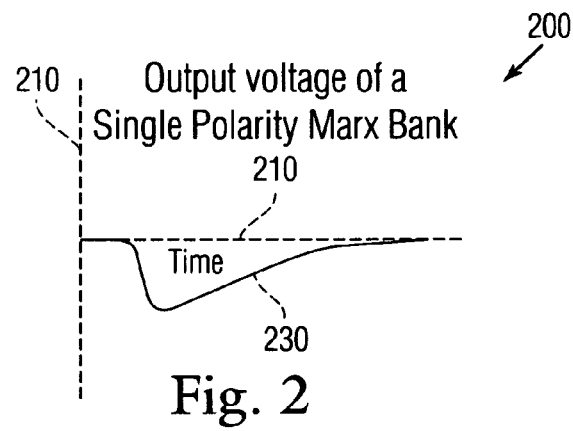
FIG. 2 is a graphical view of a voltage output from the single-polarity Marx bank.

FIG. 2 shows a graphical view 200 of output voltage from the single-polarity Marx bank 110. The abscissa 210 constitutes time and the ordinate 220 denotes the level of output voltage 130. The voltage response 230 illustrates momentary voltage decrease of output voltage 130 before asymptotically returning to initial value at ground 140.

For the single-polarity Marx bank 110 in the schematic view 100, the four capacitors 170 are charged in parallel by the input voltage 120 up to $V_o$. Once the spark gap switch 160 in the first stage closes (either by triggering or self breakdown), the rest of the switches 160 also close through breakdown resulting in a series connection of the capacitors 170.

In the case of an open or high impedance load, this series connection of the capacitors 170 results in voltage addition such that the output voltage 130 is the number of stages (n) multiplied by the input voltage 120 as $V_{in}$. The load can be considered any impedance between the HV output 130 and ground 140. This Marx bank 110 inverts the potential such that a positive input voltage 120 results in a negative output voltage 130 as $V_{out} = -n \cdot V_{in}$. The stored energy $E_{stored}$ in the Marx bank 110 equals the stored energy in one stage capacitor 170 multiplied by the number of stages as $E_{stored} = \frac{1}{2} C_{MB} \cdot V_o^2 \cdot n$.

Figure 3:
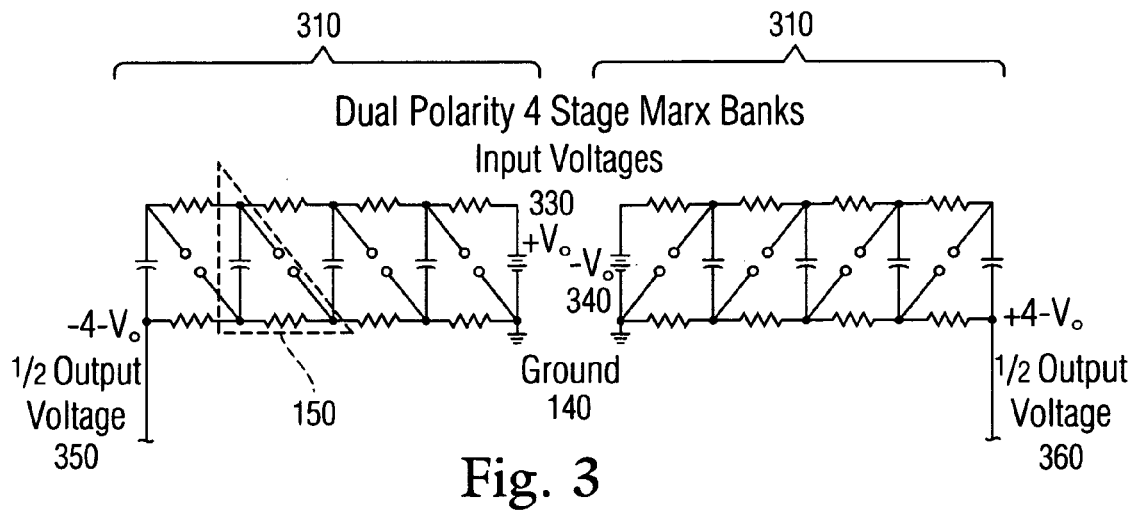
FIG. 3 is a schematic view of a dual-polarity Marx bank.

FIG. 3 shows a schematic view 300 of dual-polarity four-stage Marx banks 310 and 320 concatenated together, and each comprising a series of four circuit loops 150. The Marx banks 310 and 320 respectively connect to associated input voltages $+V_o$ as positive source 330 and $-V_o$ as negative source 340. The first Marx bank 310 also connects to half output voltage 350 of $-4 \cdot V_o$, while the second Marx bank 320 connects to half output voltage 360 of $+4 \cdot V_o$. The Marx banks 310 and 320 combines to effectively form an eight-stage Marx bank 370.

Figure 4:
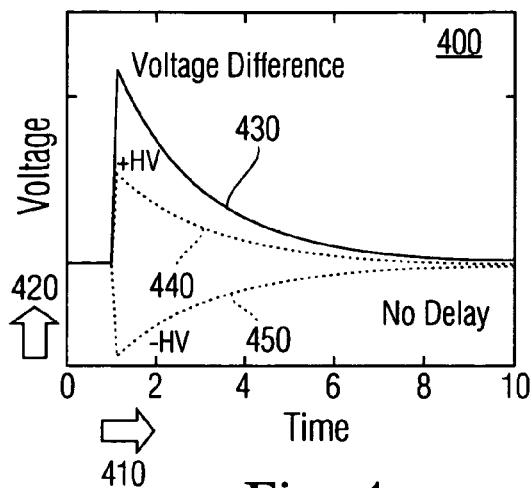
FIG. 4 is a graphical view of a voltage output from the dual-polarity Marx bank.

FIG. 4 shows a graphical view 400 of output voltages 350 and 360 of the respective dual-polarity Marx banks 310 and 320 without lag delay as ideal. The abscissa 410 denotes time in seconds, and the ordinate 420 denotes output voltage. Transient voltage difference 430 is depicted by a solid line, whereas output voltages 360 and 350 constitute +HV 440 and −HV 450 denoted by dash lines.

Figure 5:
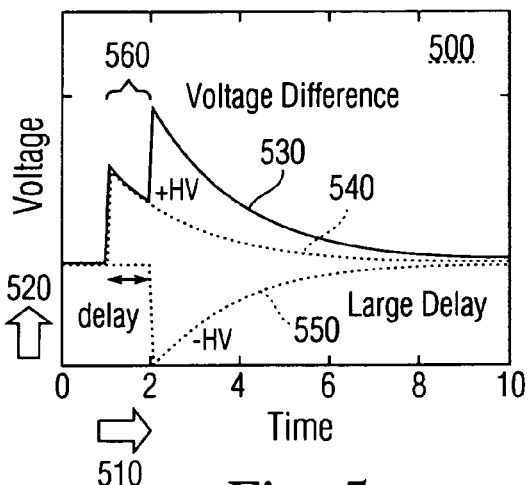
FIG. 5 is a graphical view of voltage output from the dual-polarity Marx bank with time delay.

FIG. 5 shows a graphical view 500 of output voltages 350 and 360 of the respective dual-polarity Marx banks 310 and 320 with lag delay as occurs in a conventional circuit. The abscissa 510 denotes time in seconds, and the ordinate 520 denotes output voltage. Transient voltage difference 530 is depicted by a solid line, whereas output voltages 360 and 350 constitute positive +HV 540 and negative −HV 550 denoted by dash lines. A delay 560 represents an exemplary time lag of the −HV 550 subsequent to the response of +HV 540.

In order to double the output voltage, the number of stages (n) must be increased by a factor of two (from four stages to eight stages). As the number of stages increase, the electric field at the higher end stages increase, which for a conventional circuit produces a high amount of electrical stress on insulators of the Marx bank 110 and 310, leading to unwanted breakdown. Also, the gap switches 160 of the Marx bank do not generally break down simultaneously. Hence as the number of stages increases, the Marx bank behaves more as a transmission line. Such action causes energy to be lost due to the delay 560 in the closing times of the stage switches 160.

Various exemplary embodiments provide a conceptually straight-forward process to double the output voltage of a Marx bank using a dual-polarity pulse. As described herein, the process to generate a dual-polarity pulse requires two Marx banks with two oppositely charged power supplies.

For two charging voltages being opposite in polarity in the dual-polarity Marx bank 310 and 320, the voltage difference corresponds to the sum of the outputs. For the four-stage example, the combined output can be expressed as $4 \cdot V_o - (-4) \cdot V_o = 8 \cdot V_o$, where $V_o$ represents the input voltage 120. Essentially, a dual-polarity Marx bank is a larger Marx bank divided in half and charged in the middle with two power supplies of opposite polarity.

Separately, each of the two Marx banks has sufficiently brief discharge interval that the delay in the closing times of the switches 160 is negligible. Moreover, the induced electric fields at the end of the Marx bank will not result in unacceptable electrical stresses. The first disadvantage with such an arrangement involves the necessity of two power supplies rather than a single power supply. The second disadvantage involves requiring a triggering device to trigger the two Marx banks concurrently. A delay in the trigger time can produce an undesired pulse, as shown in the graphical view 500.

Figure 6:
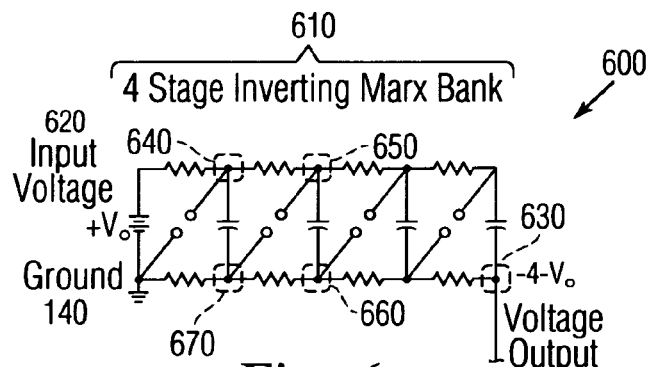
FIG. 6 is a schematic view of an inverting Marx bank.

FIG. 6 shows a schematic view 600 of a four-stage inverting Marx bank 610. Similar to the single-polarity Marx bank 110, the inverting Marx bank 610 includes input voltage 620 of $+V_o$ and output voltage 630 of $-4 \cdot V_o$. The four stages enable the output voltage 630 to be a negative multiple of four times the input voltage 620.

Each stage for the inverting Marx bank 610 includes the loop 150 and the second resistor 190, describable as a circuit having four nodes 640, 650, 660 and 670 labeled clockwise with node 640 disposed along a circuit line connecting to the positive terminal of the input voltage 620. The gap switch 160 is disposed across nodes 650 and 670. The second resistor 190 is disposed across nodes 640 and 650. The first resistor 180 is disposed across the nodes 660 and 670. The capacitor 170 is disposed across nodes 650 and 660.

The second resistor 190 connects between the input voltage 820 and the switch 160, while the first resistor 180 connects between the ground 140 and the switch 160. Thus, the switch 160 connects in parallel to the first resistor 180 and the capacitor 170 in series in a charge loop 150. Because the stages connect in parallel, one terminal of the adjacent switch 160 connects between the first resistor 180 and the capacitor 170 at the node 660.

Figure 7:
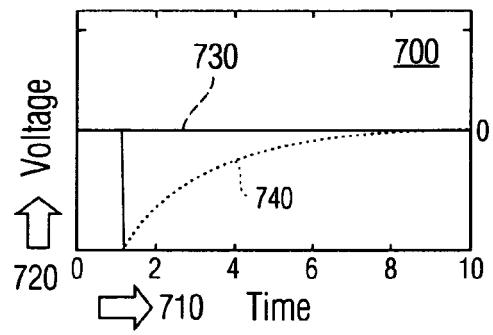
FIG. 7 is a graphical view of a voltage output from the inverting Marx bank.

FIG. 7 shows a graphical view 700 of output voltage of the inverting Marx bank 610. The abscissa 710 denotes time and the ordinate 720 denotes output voltage 620. The graph 700 shows a fixed reference value 730 contrasting with the output transient response 740 as an abrupt negative value followed by a decaying exponential return to initial value.

Figure 8:
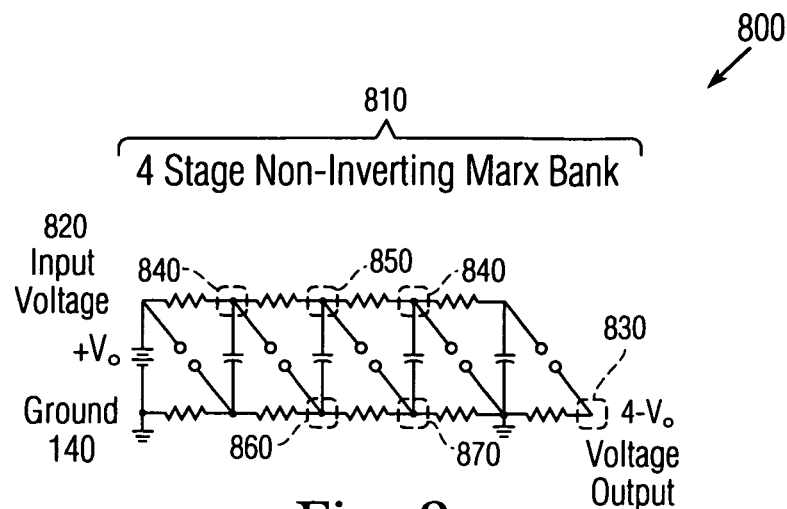
FIG. 8 is a schematic view of a non-inverting Marx bank.

FIG. 8 shows a schematic view 800 of a four-stage non-inverting Marx bank 810. In contrast to the inverting Marx bank 610, the non-inverting Marx bank 810 includes input voltage 820 of $+V_o$ and output voltage 830 of $+4 \cdot V_o$. The four stages enable the output voltage 830 to be a positive multiple of four times the input voltage 820.

Each stage for the non-inverting Marx bank 810 includes the loop 150 and the second resistor 190, describable as having four nodes 840, 850, 860 and 870 labeled counter-clockwise with node 840 disposed along a circuit line connecting to the positive terminal of the input voltage 810. The gap switch 160 is disposed across nodes 850 and 870. The second resistor 190 is disposed across nodes 840 and 850. The first resistor 180 is disposed across the nodes 860 and 870. The capacitor 170 is disposed across nodes 850 and 870.

The second resistor 190 connects between the input voltage 820 and the switch 160, while the first resistor 180 connects between the ground 140 and the switch 160. Thus, the switch 160 connects in parallel to the first resistor 180 and the capacitor 170 in series in a charge loop 150. Because the stages connect in parallel, one terminal of the adjacent switch 160 connects between the first resistor 180 and the capacitor 170 with the opposite terminal of that adjacent switch 160 connects to the node 840.

Figure 9:
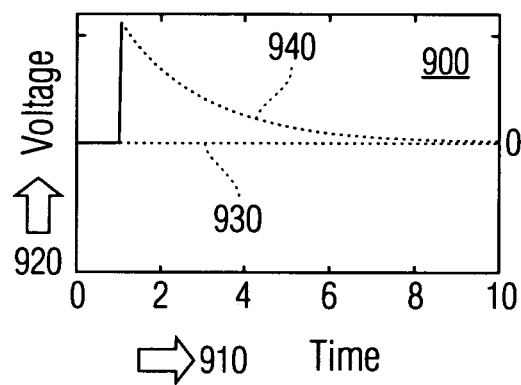
FIG. 9 is a graphical view of voltage output from the non-inverting Marx bank.

FIG. 9 shows a graphical view 900 of output voltage of the non-inverting Marx bank 810. The abscissa 910 denotes time and the ordinate 920 denotes output voltage 820. The graph 900 shows a fixed reference value 930 contrasting with the output transient response 940 as an abrupt positive value followed by a decaying exponential return to initial value.

Figure 10:
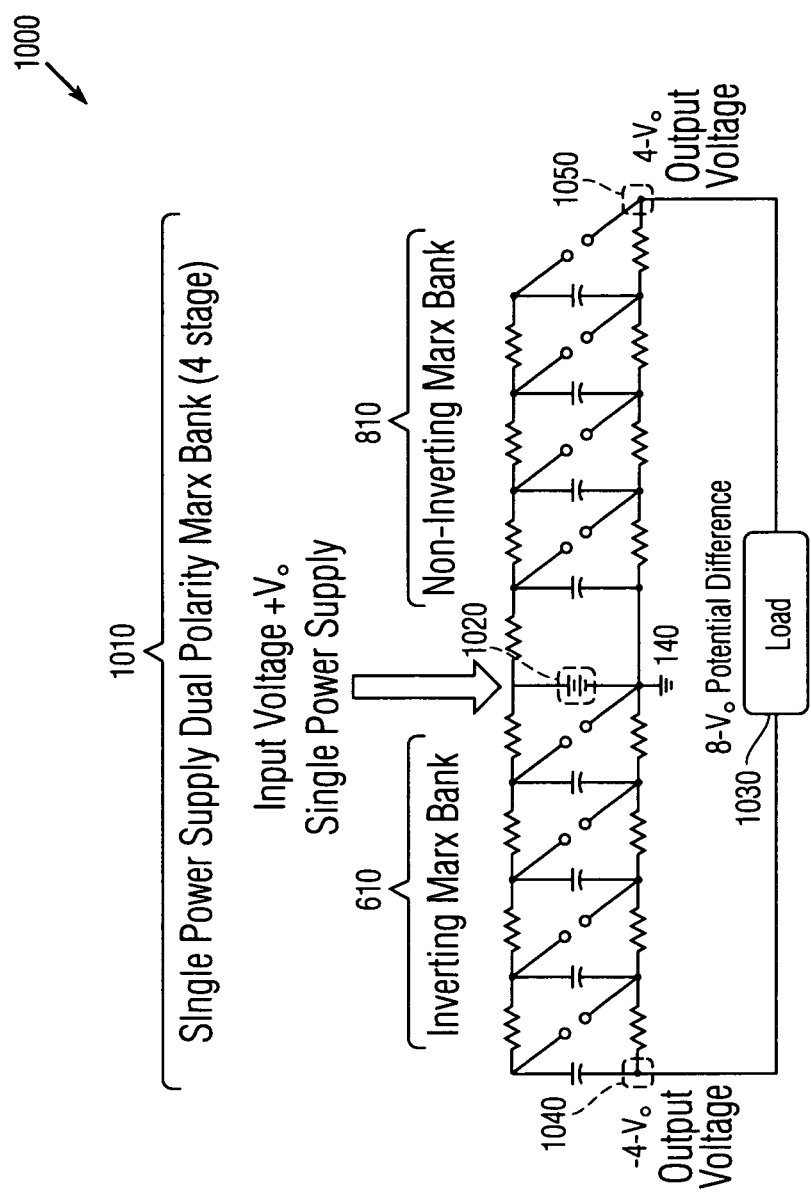
FIG. 10 is a schematic view of an exemplary dual-polarity Marx bank.

FIG. 10 shows a schematic view 1000 of an exemplary four-stage dual-polarity Marx bank 1010 with a single power supply 1020 of $+V_o$ connected to ground 140. The dual-polarity Marx bank 1010 includes the inverting Marx bank 610 and the non-inverting Marx bank 810 connected together by a load 1030. The inverting Marx bank 610 has a negative output voltage 1040 of minus four times the input voltage 1010 or $-4 \cdot V_o$. The arrangement of nodes 640 through 670 in view 1000 is counter-clockwise, in contrast to and as mirror reflection from view 600.

The non-inverting Marx bank 810 has a positive output voltage 1050 of plus four times the input voltage 1010 or $+4 \cdot V_o$. The load 1030 joining the output voltages 1040 and 1050 exhibits a total potential difference of $+8 \cdot V_o$ by subtracting the inverting output voltage 1040 of $-4 \cdot V_o$ from the non-inverting output voltage 1050 of $+4 \cdot V_o$. The exemplary Marx bank 1010 enables the doubling of the load 1030 as output voltage without inducing a delay 560.

Figure 11:
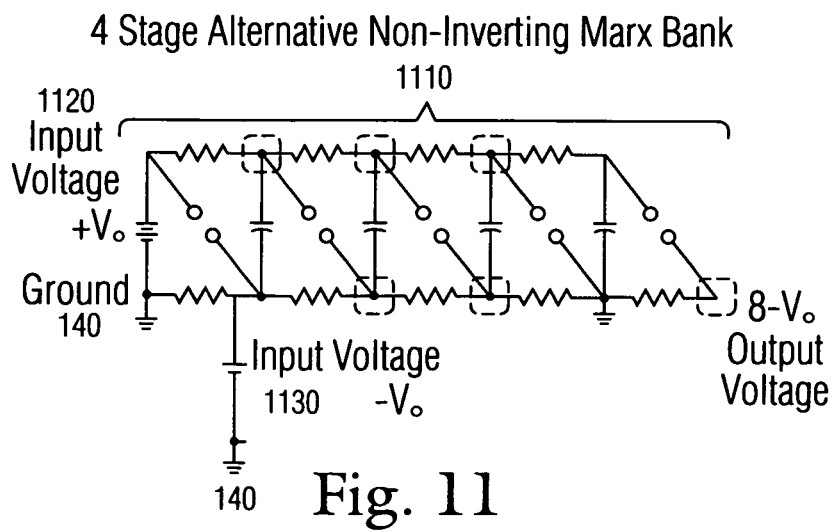
FIG. 11 is a schematic view of an alternating Marx bank.

FIG. 11 shows a schematic view 1100 of an alternative four-stage non-inverting Marx bank 1110 that lacks the advantages of the exemplary Marx bank 1010. A positive input voltage 1120 connects to ground 140 at the upper branch of the alternative Marx bank 1110. A negative input voltage 1130 connects to ground 140 at the lower branch of the Marx bank 1110. The combined input voltages 1120 and 1130 produce an output voltage 1140 of $+8 \cdot V_o$ through the four circuit stages.

The alternate Marx bank 1110 also enables the doubling of the load 1130 as output voltage without a delay 560. However, the Marx bank 1110 exhibits the same disadvantage as the Marx bank 370 by using two power supplies 1120 and 1130 instead of a single power supply 1020. Also the electrical stress is for the Marx bank 1110 equivalent to an 8-stage Marx bank utilizing one power supply.

Such configurations in views 1000 and 1100 enable the advantage of reducing initiation time for charging and discharging the circuit. Additionally such designs facilitate scalability by doubling output voltage from conventional arrangements while avoiding pulse delay. The Marx bank 1010 creates a dual-polarity pulse with a single power supply 1020 as opposed to two power supplies 330 and 340 of opposite polarity.

This dual-polarity pulse can be achieved by using the inverting Marx bank 610 and the non-inverting Marx bank 810. The inverting Marx bank 610 creates an output voltage 1040 with a polarity opposite to the input voltage 1020, whereas the non-inverting Marx bank 810 creates an output voltage 1050 with the same polarity as the input voltage 1020. The potential difference load 1030 combines the output voltages 1040 and 1050.

By placing a load between the two outputs of the non-inverting Marx bank 810 and inverting Marx bank 610, the voltage across the load 1030 doubles. Assuming the charging time and identical discharge times of the two Marx banks 610 and 810, and they use the same switches 160, the jitter reduces to the order of 100 ns without a triggering device. The jitter can be greatly reduced further by incorporating a triggering device for pulse activation by command breakdown of the switch 160.

The output of the load 1030 is the same as for an 8-stage Marx bank 370, but with the electrical stress of a 4-stage Marx bank 110. In other words, the dual-polarity Marx bank 1010 with the single power supply 1020 has the same output voltage and stored energy as an n-stage Marx bank, but with the electrical stress of a half-n-stage Marx bank, and thus much less prone to failure. Unlike other dual-polarity systems, only one power supply is needed opposed to two power supplies.

Most pulse generators are built in house for a specific application, and most of the applications are in the research field. However, as these applications leave the field of research and become commercialized (high power microwave for radar applications for example), the commercial potential will increase.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A high voltage circuit for providing an electrical voltage pulse, said circuit comprising:
    an input voltage supply having positive and negative terminals;
    a fixed ground potential that connects to said input voltage supply at said negative terminal;
    a potential difference load;
    an inverting output voltage node connecting to said load;
    an inverting Marx bank circuit having a first n-plurality of stages in parallel, connecting at a first stage of said first plurality to said positive terminal and at a last stage of said first plurality to said inverting output voltage node;
    a non-inverting output voltage node connecting to said load; and
    a non-inverting Marx bank circuit having a second n-plurality of stages in parallel, connecting at a first stage of said second plurality to said positive terminal and at a last stage of said second plurality to said non-inverting output voltage node; wherein
    said load combines said inverting output voltage of minus n-times said input voltage with said non-inverting output voltage of plus n-times said input voltage for a total of 2n-times said input voltage.

2. The circuit according to claim 1, wherein
    each stage of said first and second n-pluralities includes a charge loop and a first resistor, said charge loop having a second resistor, a gap switch and a capacitor in series, said first resistor connecting in series to said positive terminal at a first node, said charge loop having a second node connecting said first resistor to said gap switch and to said capacitor, a third node connecting said capacitor to said second resistor, and a fourth node connecting said second resistor to said gap switch, adjacent stages connect together with said gap switch connecting to a downstream adjacent first resistor at said second node, and to an upstream capacitor and second resistor at said fourth node.

3. The circuit according to claim 2, wherein said first and second resistors share identical resistance values.

* * * * *